US009870899B2

(12) United States Patent
Yang et al.

(10) Patent No.: US 9,870,899 B2
(45) Date of Patent: Jan. 16, 2018

(54) COBALT ETCH BACK

(71) Applicant: Lam Research Corporation, Fremont, CA (US)

(72) Inventors: Jialing Yang, Fremont, CA (US);
Baosuo Zhou, Redwood City, CA (US);
Meihua Shen, Fremont, CA (US);
Thorsten Lill, Santa Clara, CA (US);
John Hoang, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 14/749,285

(22) Filed: Jun. 24, 2015

(65) Prior Publication Data

US 2016/0314985 A1 Oct. 27, 2016

Related U.S. Application Data

(60) Provisional application No. 62/152,715, filed on Apr. 24, 2015.

(51) Int. Cl.
*H01L 21/3065* (2006.01)
*H01J 37/32* (2006.01)
*H01L 21/3213* (2006.01)

(52) U.S. Cl.
CPC .. *H01J 37/32449* (2013.01); *H01J 37/32899* (2013.01); *H01J 37/32926* (2013.01); *H01L 21/32136* (2013.01)

(58) Field of Classification Search
CPC ........... H01L 21/30655; H01L 21/3081; H01L 21/32136; H01J 37/32449; H01J 37/32899; H01J 37/32926
See application file for complete search history.

(56) References Cited

U.S. PATENT DOCUMENTS 4,592,801 A * 6/1986 Hara ................. H01L 21/31116
204/192.34
5,501,893 A 3/1996 Laermer et al.
(Continued)

FOREIGN PATENT DOCUMENTS

WO   WO 2016/100873    6/2016

OTHER PUBLICATIONS

S. Wolf and R.N. Tauber, (Silicon Processing for the VLSI Era, vol. 1—Process Technology, Lattice Press, 1986)(pp. 545-546).*

(Continued)

*Primary Examiner* — Duy Vu N Deo
*Assistant Examiner* — Mahmoud Dahimene
(74) *Attorney, Agent, or Firm* — Weaver Austin Villeneuve & Sampson, LLP.

(57) ABSTRACT

Methods of etching cobalt on substrates are provided. Some methods involve exposing the substrate to a boron-containing halide gas and an additive, and exposing the substrate to an activation gas and a plasma. Additives improve selectively depositing a thicker layer of a boron-containing halide material on a surface of a mask than on a surface of a metal. Additives include $H_2$, $CH_4$, $CF_4$, $NF_3$, and $Cl_2$. Boron-containing halide gases include $BCl_3$, $BBr_3$, $BF_3$, and $BI_3$. Exposures may be performed in two or more cycles, with variations in durations and/or bias power for each exposure in the two or more cycles.

19 Claims, 7 Drawing Sheets

(56) References Cited

U.S. PATENT DOCUMENTS

| | | | |
|---|---|---|---|
| 6,022,806 | A | 2/2000 | Sato et al. |
| 6,177,353 | B1* | 1/2001 | Gutsche ............ H01L 21/02071 |
| | | | 257/E21.311 |
| 6,448,192 | B1 | 9/2002 | Kaushik |
| 6,482,745 | B1* | 11/2002 | Hwang ............ H01L 21/32136 |
| | | | 257/E21.311 |
| 7,196,955 | B2 | 3/2007 | Nickel |
| 7,795,148 | B2 | 9/2010 | Brown |
| 8,252,194 | B2 | 8/2012 | Kiehlbauch et al. |
| 8,808,561 | B2 | 8/2014 | Kanarik |
| 8,883,028 | B2 | 11/2014 | Kanarik |
| 8,993,352 | B2 | 3/2015 | Nishimura et al. |
| 9,130,158 | B1 | 9/2015 | Shen et al. |
| 9,257,638 | B2 | 2/2016 | Tan et al. |
| 9,449,843 | B1 | 9/2016 | Korolik et al. |
| 9,576,811 | B2 | 2/2017 | Kanarik et al. |
| 2001/0053585 | A1 | 12/2001 | Kikuchi et al. |
| 2002/0009883 | A1 | 1/2002 | Ogure et al. |
| 2002/0058409 | A1 | 5/2002 | Lin et al. |
| 2002/0081381 | A1 | 6/2002 | DelaRosa et al. |
| 2004/0004056 | A1* | 1/2004 | Sasaki ................ B82Y 10/00 |
| | | | 216/22 |
| 2004/0137749 | A1 | 7/2004 | Ying et al. |
| 2004/0209476 | A1* | 10/2004 | Ying ................. B82Y 25/00 |
| | | | 438/706 |
| 2005/0006222 | A1 | 1/2005 | Ding et al. |
| 2005/0098440 | A1 | 5/2005 | Kailasam et al. |
| 2006/0009040 | A1* | 1/2006 | Tomioka ........... H01L 21/02071 |
| | | | 438/710 |
| 2006/0194435 | A1 | 8/2006 | Nishimura et al. |
| 2007/0049036 | A1 | 3/2007 | Huang |
| 2007/0202254 | A1 | 8/2007 | Ganguli et al. |
| 2007/0238301 | A1 | 10/2007 | Cabral et al. |
| 2007/0246442 | A1 | 10/2007 | America et al. |
| 2009/0020884 | A1 | 1/2009 | Lee et al. |
| 2009/0226611 | A1 | 9/2009 | Suzuki et al. |
| 2009/0256220 | A1 | 10/2009 | Horng et al. |
| 2011/0139748 | A1 | 6/2011 | Donnelly et al. |
| 2011/0212274 | A1 | 9/2011 | Selsley |
| 2012/0009785 | A1 | 1/2012 | Chandrashekar et al. |
| 2012/0115329 | A1 | 5/2012 | Chandrashekar et al. |
| 2012/0276657 | A1 | 11/2012 | Joubert et al. |
| 2013/0105303 | A1 | 5/2013 | Lubomirsky et al. |
| 2013/0168354 | A1 | 7/2013 | Kanarik |
| 2015/0037972 | A1 | 2/2015 | Danek et al. |
| 2015/0214474 | A1* | 7/2015 | Nishimura ........... C21D 8/1277 |
| | | | 438/3 |
| 2015/0270140 | A1 | 9/2015 | Gupta et al. |
| 2016/0020152 | A1 | 1/2016 | Posseme |
| 2016/0203995 | A1 | 7/2016 | Kanarik et al. |
| 2016/0308112 | A1 | 10/2016 | Tan et al. |
| 2017/0040214 | A1 | 2/2017 | Lai et al. |
| 2017/0053810 | A1 | 2/2017 | Yang et al. |
| 2017/0117159 | A1 | 4/2017 | Kanarik et al. |
| 2017/0229311 | A1 | 8/2017 | Tan et al. |

OTHER PUBLICATIONS

U.S. Appl. No. 14/696,254, filed Apr. 24, 2015, entitled "Integrating Atomic Scale Processes: ALD (Atomic Layer Deposition) and ALE (Atomic Layer Etch)."

U.S. Appl. No. 14/325,190, filed Jul. 7, 2014, entitled "Method to Etch Non-Volatile Metal Materials."

Puurunen, Rikka L. (2005) "Surface chemistry of atomic layer deposition: A case study for the trimethylaluminum/water process," *Journal of Applied Physics*, 97:121301-51 pages.

U.S. Appl. No. 14/749,291, filed Jun. 24, 2015, entitled "Dry Plasma Etch Method to Pattern MRAM Stack."

U.S. Patent Application entitled, "Atomic Layer Etching of Tungsten for Enhanced Tungsten Deposition Fill," U.S. Appl. No. 14/830,683, filed Aug. 29, 2015.

US Office Action dated Jul. 1, 2016 issued in U.S. Appl. No. 14/830,683.

Boullart et al. (Mar. 29, 2013) "STT MRAM patterning challenges," *Proc. SPIE, Advanced Etch Technology for Nanopatterning II, Proc. of SPIE* 8685:86850F-1-86850F-9 [Retrieved on Jun. 2, 2015 from http://proceedings.spiedigitallibrary.org].

Carver et al. (Feb. 20, 2015) "Atomic Layer Etching: An Industry Perspective," *ECS Journal of Solid State Science and Technology*,4(6):N5005-N5009.

Ditizio, Robert and Werbaneth, Paul, Tegal Corporation and Zhu, Jian-Gang, Carnegie Mellon University (Jan. 2004) "Cell Shape and Patterning Considerations for Magnetic Random Access Memory (MRAM) Fabrication," Reprinted with permission from *Semiconductor Manufacturing Magazine*, 7 pp.

Jiang et al. (1998) "Complexes Containing Unbridged Dative Metal-Metal Bonds and the Strong Acceptor $Ru(CO)_3(SiCl_3)_2$ Moiety. Comments on the Transition Metal to Silicon Bond," *Organometallics*, 17(26):5810-5819.

Kanarik et al. (Mar./Apr. 2015) "Overview of atomic layer etching in the semiconductor industry," *J. Vac. Sci. Technol. A* 33(2):020802-1-020802-14.

Lee et al. (2015) "Atomic Layer Etching of $Al_2O_3$ Using Sequential, Self-Limiting Thermal Reactions with $Sn(acac)_2$ and Hydrogen Fluoride," $^{ACS}NANO$,9(2):2061-2070.

Pomeroy, R.K. and Wijesekera, K.S. (1980) "Preparation and derivatives of cis-$M(CO)_4(SiCl_3)_2$ (M = FE, RU, OS)," *Inorg. Chem.*, 19(12):3729-3735.

Schmitt et al. (2006) "Synthesis and Properties of Single-Crystal FeSi Nanowires," *Nano Lett.*, 6(8):1617-1621.

Schmitt et al. (Feb. 1, 2008) "Chemical Synthesis and Magnetotransport of Magnetic Semiconducting $Fe_{1-x}Co_xSi$ Alloy Nanowires," *Nano Lett.*, 8(3):810-815.

U.S. Appl. No. 15/400,368, filed Jan. 6, 2017, entitled "Integrating Atomic Scale Processes: ALD (Atomic Layer Deposition) and ALE (Atomic Layer Etch)."

U.S. Patent Application entitled, "Atomic Layer Etching of Tungsten and Other Metals," U.S. Appl. No. 15/239,138, filed Aug. 17, 2016.

US Office Action dated Jun. 17, 2016 issued in U.S. Appl. No. 14/696,254.

US Notice of Allowance dated Oct. 14, 2016 issued in U.S. Appl. No. 14/696,254.

US Office Action dated Nov. 28, 2016 issued in U.S. Appl. No. 14/749,291.

US Final Office Action dated Feb. 7, 2017 issued in U.S. Appl. No. 14/830,683.

US Notice of Allowance dated Jun. 29, 2017 issued in U.S. Appl. No. 15/400,368.

Kanarik et al. (2017) "Predicting synergy in atomic layer etching," *J. Vac. Sci. Technol.* A,35(5):05C302-1 through 05C302-7.

U.S. Appl. No. 15/581,951, filed Apr. 28, 2017, Reddy et al.

U.S. Appl. No. 15/582,359, filed Apr. 28, 2017, Agarwal et al.

U.S. Appl. No. 15/286,421, filed Oct. 5, 2016, Tan et al.

US Office Action dated Mar. 24, 2017 issued in U.S. Appl. No. 15/286,421.

Faraz et al., (Mar. 24, 2015) "Atomic Layer Etching: What Can We Learn from Atomic Layer Deposition?," ECS Journal of Solid State Science and Technology, 4(6):N5023-N5032.

Gottscho, Richard (Jul. 16, 2017) "Atomic Layer Etching—An Overview of Possibilities and Limitations," *Plenary Talk presented at American Vacuum Society 17th International Conference on Atomic Layer Deposition (ALD 2017) and 4th International Atomic Layer Etching Workshop (ALE 2017)*, Lam Research Corp., 21pp.

US Notice of Allowance dated Jun. 30, 2017 issued in U.S. Appl. No. 14/749,291.

US Office Action dated Jul. 25, 2017 issued in U.S. Appl. No. 14/830,683.

US Office Action dated Aug. 25, 2017 issued in U.S. Appl. No. 15/239,138.

* cited by examiner

COBALT ETCH BACK

CROSS-REFERENCE TO RELATED APPLICATIONS

This application claims benefit of U.S. Provisional Patent Application No. 62/152,715, filed Apr. 24, 2015, and titled "COBALT ETCH BACK," which is incorporated by reference herein in its entirety and for all purposes.

BACKGROUND

Semiconductor fabrication processes include fabrication of interconnects to form circuits. Interconnects may be formed with copper, capped by liners such as tantalum and/or tantalum nitride, or may be formed with tungsten. However, a copper interconnect may result in electromigration, which can lead to void formation and device failure and tungsten interconnects may have a higher resistivity. As a result, interconnects formed using other metals are of interest.

SUMMARY

Provided herein are methods of processing substrates. One aspect involves a method of processing a substrate in a chamber, the method including (a) exposing the substrate to a boron-containing halide gas and an additive selected from the group consisting of hydrogen-containing and halogen-containing gases for a duration sufficient to selectively deposit a first layer of boron-containing halide material on a surface of a mask and a second layer of boron-containing halide material on a surface of a metal on the substrate, whereby the first layer is thicker than the second layer, and (b) exposing the substrate to an activation gas and an activation source. The duration of (a) may be between about 5 seconds and about 60 seconds.

The method may further include repeating (a) and (b) in a first set of cycles to deposit the boron-containing halide layer on the substrate. In some embodiments, the method may further include repeating (a) and (b) in a second set of cycles to etch metal. The substrate may be etched to form contacts. In some embodiments, the substrate is etched by subtractive etch on a blanket layer of a metal.

The duration of (a) during the second set of cycles may be shorter than the duration of (a) during the first set of cycles. In some embodiments, the duration of (b) during the second set of cycles is longer than the duration of (b) during the first set of cycles. The number of cycles in the second set may be different from the number of cycles in the first set.

In various embodiments, a bias is applied during (b). In some embodiments, a bias is applied during (b) at a first bias power during the first set of cycles, and a second bias power during the second set of cycles. In some embodiments, the first bias power may be between about 20 Vb and about 100 Vb. In some embodiments, the second bias power may be between about 30 Vb and about 150 Vb. The first bias power may be greater than the second bias power. In some embodiments, the first bias power is less than the second bias power.

The additive may be any of $H_2$, $CH_4$, $CF_4$, $NF_3$, $Cl_2$, and combinations thereof. In various embodiments, the activation gas includes argon. In some embodiments, the activation gas may be any of Ar, $H_2$, $CH_4$, $CF_4$, He, Ne, Xe, $NF_3$, and combinations thereof.

The boron-containing halide gas may be any of $BCl_3$, $BBr_3$, $BF_3$, and $BI_3$. In various embodiments, the metal may be any of cobalt, iron, manganese, nickel, platinum, palladium, ruthenium, and combinations thereof.

In some embodiments, the metal surface is recessed relative to the mask surface. In various embodiments, the method further includes prior to performing (a) or (b), wet etching the substrate to partially recess the metal.

In various embodiments, the activation source is a plasma. In various embodiments, the plasma power is between about 100 W and about 1500 W. In some embodiments, the substrate is patterned. The chamber pressure may be between about 2 mT and about 90 mT. In various embodiments, the method includes purging the chamber between exposures.

In some embodiments, substantially no compounds are re-deposited onto sidewalls of features on the substrate. In various embodiments, roughness of the surface of the metal is less than about 5 nm RMS.

In some embodiments, during (b), exposing the substrate to the activation source may include ion beam etching or reactive ion etching. In various embodiments, (a) and (b) are performed without breaking vacuum. In some embodiments, (a) and (b) are performed in the same chamber. In some embodiments, (a) and (b) are performed in different modules of the same apparatus.

In various embodiments, at least one of (a) and (b) includes a self-limiting reaction. In various embodiments, the mask includes a non-metal. In some embodiments, the mask includes another metal different from the composition of the metal.

Another aspect involves an apparatus for processing a substrate, the apparatus including: (a) one or more process chambers, each process chamber including a chuck; (b) one or more gas inlets into the process chambers and associated flow-control hardware; and (c) a controller having at least one processor and a memory, whereby the at least one processor and the memory are communicatively connected with one another, the at least one processor is at least operatively connected with the flow-control hardware, and the memory stores computer-executable instructions for controlling the at least one processor to at least control the flow-control hardware by: (i) flowing a boron-containing halide gas and an additive to one of the one or more process chambers, for a duration sufficient to selectively deposit a first layer of boron-containing halide material on a surface of a mask and a second layer of boron-containing halide material on a surface of a metal on the substrate, wherein the additive may be any of hydrogen-containing and halogen-containing gases, whereby the first layer is thicker than the second layer; and (ii) flowing an activation gas to one of the one or more process chambers and igniting an activation source. In various embodiments, the boron-containing halide gas, the additive, and the activation gas are flowed without breaking vacuum. In various embodiments, the apparatus includes a plasma generator. In some embodiments, the apparatus generates an inductively coupled plasma. In some embodiments, the apparatus generates a capacitively coupled plasma. In various embodiments, the activation source is a plasma.

These and other aspects are described further below with reference to the drawings.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

In semiconductor fabrication, a primary role of back-end-of line (BEOL) is to form interconnects to connect discrete devices to create functional circuits. As device feature size and hence interconnects continue to shrink, there is a growing challenge in preventing degradation of interconnect performance due at least in part to an increase in resistance-capacitance (RC) delay.

Typically, interconnects are formed with copper, using dual damascene processing techniques and copper interconnects are capped by liners, such as a tantalum and/or tantalum nitride liner. One of the major concerns with copper interconnect structures is that they are highly susceptible to electromigration, which can lead to void formation and device failure. Some processes involve high-k metal gate filling with tungsten, and tungsten may also be used to form a metal contact to a source/drain contact. However, tungsten has a high sheet resistance compared to metals such as cobalt, particularly in small features. Small features may have a technology node less than about 10 nm. This and other issues have led to interest in the use of other metals as interconnects.

Provided herein are methods of using cobalt (Co) as an interconnect material. Cobalt filling may reduce the formation of voids in features, and amongst other things, reduce electromigration concerns.

Replacing copper with Co introduces its own processing challenges, including, for example, etching of Co. Currently, Co can be etched back using a wet process. However, the wet etch rate can be variable with changes in feature size. In addition, the wet process may cause the surface of the substrate to be significantly rough, e.g., rougher than a surface etched by a dry process. Etching back Co using anisotropic plasma etching has proven to be very difficult as the etch products are almost all or often non-volatile. Non-volatile etch products may result in re-deposition of the etch products or defects on other exposed components of the substrate. These re-deposited defects contain metal and are difficult if not impossible to remove. As a result, plasma etching of this metal is often conventionally achieved with physical sputtering, which unfortunately leads to etch selectivity so poor that the process cannot be used in production.

Figure 1:
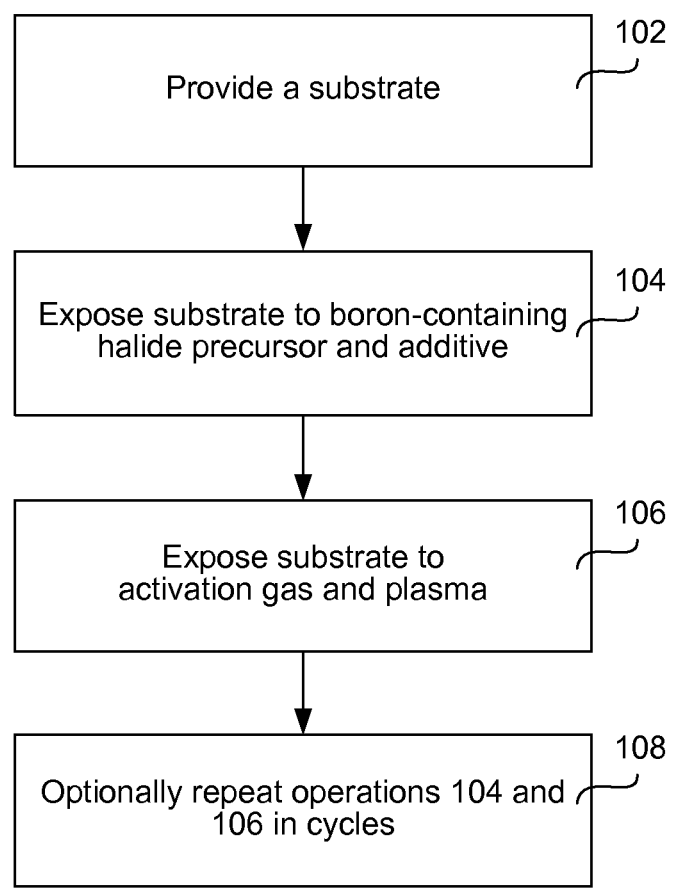
FIG. 1 is a process flow diagram depicting operations of a method performed in accordance with disclosed embodiments.

This disclosure provides a selective plasma etch of Co. FIG. 1 provides a process flow diagram for performing operations in accordance with disclosed embodiments. In operation 102, a substrate or wafer is provided. The substrate may be a silicon wafer, e.g., a 200-mm wafer, a 300-mm wafer, or a 450-mm wafer, including wafers having one or more layers of material, such as dielectric, conducting, or semi-conducting material, deposited thereon. In examples provided herein, the substrate may include a Co layer.

In various embodiments, the substrate is patterned. In some embodiments, a patterned substrate may include a variety of topography across the substrate. In some embodiments, partially fabricated gates may be present on the substrate. For example, a substrate may include a Co layer with a hard mask deposited over the Co layer. In some embodiments, the hard mask may already be patterned. The substrate may also be prepared by partially wet etching the Co to form a pattern whereby Co is partially recessed.

A patterned substrate may have "features" such as vias or contact holes, which may be characterized by one or more of narrow and/or re-entrant openings, constrictions within the features, and high aspect ratios. The features may be formed in one or more of the above described layers. One example of a feature is a hole or via in a semiconductor substrate or a layer on the substrate. Another example is a trench in a substrate or layer. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

In various embodiments, types of substrates fabricated from performing disclosed embodiments may depend on the aspect ratio of various features on the substrate prior to performing disclosed embodiments. In some embodiments, features on a substrate provided in operation 102 may have an aspect ratio of at least about 2:1, at least about 4:1, at least about 6:1, at least about 10:1, or higher. The feature may also have a dimension near the opening, e.g., an opening diameter or line width of between about 10 nm to 500 nm, for example between about 25 nm and about 300 nm. Disclosed methods may be performed on substrates with features having an opening less than about 150 nm. A via, trench or other recessed feature may be referred to as an unfilled feature or a feature. According to various embodiments, the feature profile may narrow gradually and/or include an overhang at the feature opening. A re-entrant profile is one that narrows from the bottom, closed end, or interior of the feature to the feature opening. A re-entrant profile may be generated by asymmetric etching kinetics during patterning and/or the overhang due to non-conformal film step coverage in the previous film deposition, such as deposition of a diffusion barrier. In various examples, the feature may have a width smaller in the opening at the top of the feature than the width of the bottom of the feature. Features as described herein may be on a substrate to be etched per disclosed embodiments such as described herein with respect to FIG. 1.

In operation 104, the substrate is exposed to a boron-containing halide gas to selectively deposit a boron-containing halide layer on the substrate such that more material is deposited on some metal or non-metal surfaces, such as on a hard mask or other type of mask, than on other metal surfaces. A boron-containing halide layer may also be referred to herein as a boron-containing halide material or polymer. The term "halide" as used herein may also be referred to as "halogen-containing." In various embodiments, a boron-containing halide layer is a boron-containing halogen-containing layer. Metals for which there may be a thinner boron-containing halide layer deposited may include non-volatile metals, such as cobalt (Co), iron (Fe), manganese (Mn), nickel (Ni), platinum (Pt), palladium (Pd), and ruthenium (Ru).

During operation 104, the substrate may also be exposed to an additive. The additive may help material build-up of the boron-containing halide layer on the mask, or may also increase a metal etch as described herein. In some embodiments, the additive may improve recessing a Co metal, such as by increasing the etch rate of Co. Example additives include $H_2$, $CH_4$, $CF_4$, $NF_3$, and $Cl_2$. The ratio of additive flow to boron-containing halide gas flow may be between about 5% and about 50%, depending on the gas chemistry used.

Without being bound by a particular theory, it is believed that boron may be helpful to achieve etch selectivity of metal to a gate mask as described herein. For example, using a boron-containing halide may improve selectivity of etching Co to a gate mask. A boron-containing halide gas deposits boron-containing halide material, which is more easily removed by stripping or using a wet etch process.

In various embodiments, the material selectively deposits thicker on a mask material than on a metal material such as Co. For example, the mask may include nitrogen, oxygen, carbon, and titanium atoms. In some embodiments, the mask is an ashable hard mask made primarily of carbon material. In some embodiments, the mask is a TiN layer. In various embodiments, deposition in this operation is non-conformal. In some embodiments, the selective deposition is dependent on the aspect ratio of the feature. For example, various disclosed embodiments may be suitable for selectively depositing a boron-containing halide material on substrates having an aspect ratio of between about 1:1 and about 10:1.

Operation 104 is performed for a duration between about 5 seconds and about 60 seconds. In various embodiments, the duration of operation 104 may be controlled to selectively deposit a boron-containing halide layer. In some embodiments, exposure to the boron-containing halide gas for too long of a duration may result in non-selective deposition. The duration may depend on the aspect ratio and/or the size of the opening where a metal such as Co will be etched. For example, for some substrates having certain aspect ratios, a duration that is too long may result in the thickness of the deposited film on mask surfaces being approximately equal to the thickness of the deposited film on surfaces of a metal to be etched.

In some embodiments, the boron-containing halide layer on the hard mask material is deposited to a thickness between about 1 nm and about 20 nm. In some embodiments, the boron-containing halide layer on cobalt is deposited to a thickness between about 2 nm and about 10 nm.

In operation 106, the substrate is exposed to an activation gas and an activation source, such as a plasma. The activation gas may include one or more reactive or non-reactive gases, such as argon (Ar), hydrogen ($H_2$), methane ($CH_4$), carbon tetrafluoride ($CF_4$), nitrogen trifluoride ($NF_3$), helium (He), neon (Ne), or xenon (Xe). As further described below, the combination of activation gases activated by a plasma may react with the boron-containing halide layer on the surface of the substrate to form etch products. Using one or more activation gases may facilitate uniformity and selectivity in the formation of a $BX_x$ chemisorption layer (where X may be a halide, such as chlorine, bromine, or iodine and x may be an integer or other number depicting stoichiometry of the chemisorption layer). In some embodiments, the additive flowed in operation 104 may be flowed during operation 106. The additive may improve removal of the deposited boron-containing halide layer, increase metal etch rate, and/or smoothen the surface of the metal. For example, the additive may be flowed during operation 106 to smooth a Co layer or to further etch a Co layer as described herein. The ratio of additive flow to boron-containing halide gas flow may be between about 5% and about 50%, depending on the gas chemistry used.

The plasma may be an in situ or remote plasma. The plasma may be generated using a power between about 100 W and about 1500 W. In some embodiments, a low bias is also applied during operation 106. For example, the bias may be set at about 50 Vb, but may be modulated to achieve various etch rates and extent of etch. In some embodiments, alternative activation sources other than plasma may be used. In some embodiments, reactive ion etching or ion beam etching may be used instead of a plasma. Activation sources, such as plasma, reactive ion etching, and ion beam etching, may ionize the activation gas to form an activated activation gas to react with the substrate. Operation 106 may be performed for a duration between about 10 and about 60 seconds.

In operation 108, operations 104 and 106 are optionally repeated in cycles. For example, operation 104 and 106 may be repeated to provide a net deposition of a boron-containing halide layer on the substrate. In some embodiments, operations 104 and 106 are repeated to provide a net etch of the boron-containing halide layer and metal on the substrate. Since the boron-containing halide layer deposited on mask surfaces is thicker than on metal surfaces, the boron-containing halide material on the metal is etched completely before the boron-containing halide material deposited on the mask surfaces. As a result, as etching continues in multiple cycles, the boron-containing halide layer protects the hard mask from degrading, while the exposed metal layers are etched.

Some disclosed embodiments may involve integrating atomic layer deposition (ALD) and atomic layer etch (ALE) processes, which may be performed without breaking vacuum. For example, in some embodiments of FIG. 1, deposition during operation 104 is conformal. Operation 104 may be performed in a self-limiting reaction. For example, in some embodiments, operation 104 is deposited using ALD. ALD is a technique that deposits thin layers of material using sequential self-limiting reactions. ALD may be performed using any suitable technique. In various embodiments, ALD may be performed with plasma, or may be performed thermally. Operation 104 may be performed in cycles.

The concept of an "ALD cycle" is relevant to the discussion of various embodiments herein. Generally an ALD cycle is the minimum set of operations used to perform a surface deposition reaction one time. The result of one cycle is production of at least a partial silicon-containing film layer on a substrate surface. Typically, an ALD cycle includes operations to deliver and adsorb at least one reactant to the substrate surface, and then react the adsorbed reactant with one or more reactants to form the partial layer of film. The cycle may include certain ancillary operations such as sweeping one of the reactants or byproducts and/or treating the partial film as deposited. Generally, a cycle contains one instance of a unique sequence of operations. As an example, an ALD cycle may include the following operations: (i) delivery/adsorption of a precursor or first reactant in a chamber, (ii) purging of the precursor from the chamber, (iii) delivery of a second reactant and an optional plasma, and (iv) purging of plasma and byproducts from the chamber.

In some embodiments, operation 106 initiates a self-limiting etch of the substrate. For example, a combination of an activated activation gas, plasma, and activated halides from the surface of the substrate as deposited in operation 104 may perform an atomic layer etch. The concept of an "ALE cycle" is relevant to the discussion of various embodiments herein. Generally an ALE cycle is the minimum set of operations used to perform an etch process one time, such as etching a monolayer. The result of one cycle is that at least some of a film layer on a substrate surface is etched. Typically, an ALE cycle includes a modification operation to form a modified layer, followed by a removal operation to remove or etch only this modified layer. The cycle may include certain ancillary operations such as sweeping one of the reactants or byproducts. Generally, a cycle contains one instance of a unique sequence of operations. As an example, an ALE cycle may include the following operations: (i) delivery of a reactant gas to a chamber, (ii) purging of the reactant gas from the chamber, (iii) delivery of a removal gas and an optional plasma, and (iv) purging of the chamber. In some embodiments, etching may be performed nonconformally.

Figure 2A:
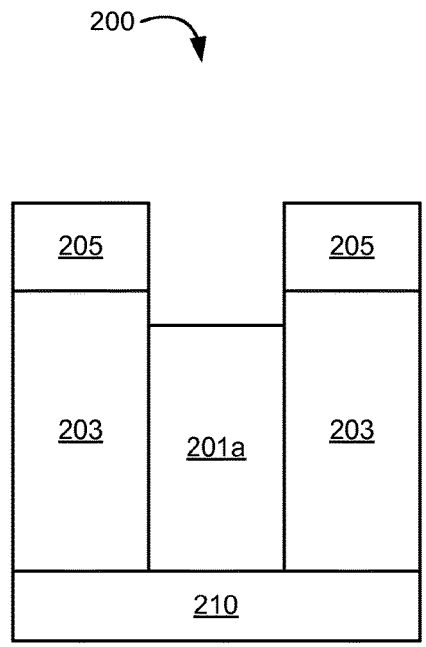
FIGS. 2A-2D are schematic illustrations of an example of a gate structure processed in accordance with disclosed embodiments.

An example process is described below with reference to FIGS. 2A-2D, which depicts a Co interconnect 201a in a gate structure 200. Referring to FIG. 2A, in this embodiment, after Co fill and planarization (e.g., by chemical mechanical polishing (CMP)), the structure 200 is composed of two regions of hard mask 205 overlying two regions of gate material 203, with the Co interconnect 201a situated between the two regions of gate material 203 on a substrate 210. The material of the hard mask 205 may be a non-metal in various embodiments. The material of the hard mask 205 may include a metal in various embodiments. The hard mask material may be a metal different from that of the Co interconnect 201a. In some embodiments, the material of the hard mask 205 may be titanium nitride or tantalum nitride. The hard mask 205 and gate material 203 may also generally be separated by dielectric spacers, not shown in the figure so as not to detract from a simple illustration of a process in accordance with this disclosure. As shown in FIG. 2A, the Co interconnect 201a is partially recessed back by a wet process so that the top of the Co interconnect 201a is etched more and lower than the top of the interface between the hard mask 205 and the gate material 203.

Figure 2B:
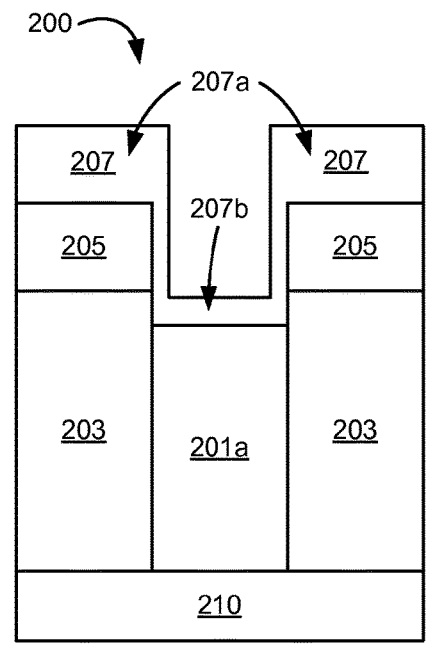

In FIG. 2B, plasma etching with cyclic steps of deposition using a boron-containing halide chemistry and activation using reactive or non-reactive gases is carried out to further recess the Co interconnect 201a. Referring to FIG. 2B, a $BCl_3$ deposition can be used to form a $BCl_x$ layer 207 over substrate 210. As shown in the Figure, 207a refers to the part of the $BCl_x$ layer 207 that is deposited on top of the hard mask 205, while 207b refers to the part of the $BCl_x$ layer 207 that is deposited on top of the Co interconnect 201a.

Note that the part of the $BCl_x$ layer 207a formed on top of the hard mask 205 during the deposition step is thicker than the part of the $BCl_x$ layer 207b that formed on top of the Co interconnect 201a. The composition of $BCl_x$ layer 207a may be different from the composition of $BCl_x$ layer 207b at the interface with the Co interconnect 201a, and such composition difference may contribute to the selectivity as described below.

Without limiting the disclosure by any particular theory of operation, the composition and thickness difference is believed to be due to a combination of chemical and mechanical factors. The deposition chemistry of $BCl_3$ with additives such as $H_2$, $CH_4$, $CF_4$, $NF_3$, and $Cl_2$ preferentially deposits on the hard mask 205 due at least in part to the reaction/attachment of boron with N, O, or C in the material of the hard mask 205. Chlorine in the deposition chemistry reacts/attaches to the surface of the Co interconnect 201a, and boron can also attach to chlorine in subsequent exposures, but the reaction generally proceeds more slowly on the surface of the Co interconnect 201a than at the surface of the hard mask 205, and the recessed aspect of the surface of the Co interconnect 201a further slows film growth, resulting in differentiation in the thickness of the deposited $BCl_x$ layer 207. Accordingly, the part of the $BCl_x$ layer 207a that formed on top of the hard mask 205 is thicker than the part of the $BCl_x$ layer 207b that formed on the top of the Co interconnect 201a. This differentiation in deposition thickness is most pronounced in the early cycles of the deposition, particularly at the interface. Deposition, activation, and/or etch strategies can be tailored accordingly, as discussed with reference to the cycling of various operations as described below and above with respect to FIG. 1. In other embodiments, $BCl_3$ used in this process can be replaced with other halide chemistry that can provide comparable deposition and activation functions, such as $BBr_3$ or $BI_3$ or $BF_3$. Note that in various embodiments, the sidewalls of the $BCl_x$ layer 207 remains on the substrate after etching; that is, some of the $BCl_x$ layer 207 remains on the sidewall of the hard mask 205 and partially on the sidewall of the gate material 203 after the Co interconnect 201a is etched.

Figure 2C:
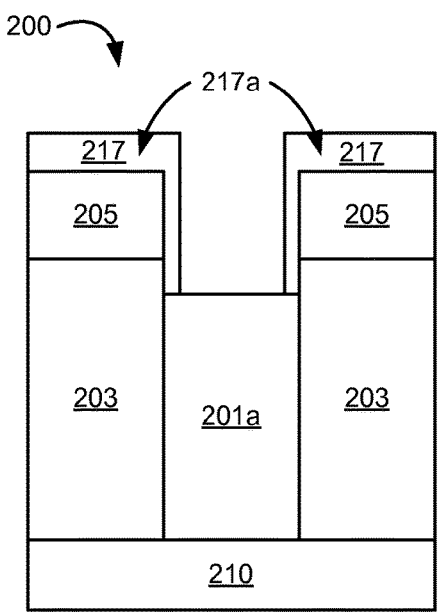

The $BCl_x$ layer 207 serves both as a protective barrier and a source of reactive species to form etch products. Referring to FIG. 2C, during activation, the part of the $BCl_x$ layer 207b on the Co interconnect 201a is activated with ion energy and reacts with Co to form etch products. An activation gas, such as argon optionally in combination with other gases, such as $H_2$, $CH_4$, $CF_4$, $Cl_2$, or $NF_3$, facilitates uniformity and selectivity in the formation of a $BCl_x$ chemisorption layer 217. Alternative activation gases can include other inert gases such as He, Ne, and Xe. Disclosed embodiments also reduce re-deposition of etch products (e.g., allowing non-deposition of sputtered species that may be used during activation). Note that since a thicker layer was deposited over the hard mask 205, some $BCl_x$ chemisorption layer 217 remains on these surfaces, while the entirety of the part of the $BCl_x$ layer 207b on the surface of the Co interconnect 201a is etched completely as shown in FIG. 2C, thereby exposing the surface of the Co interconnect 201a.

Figure 2D:
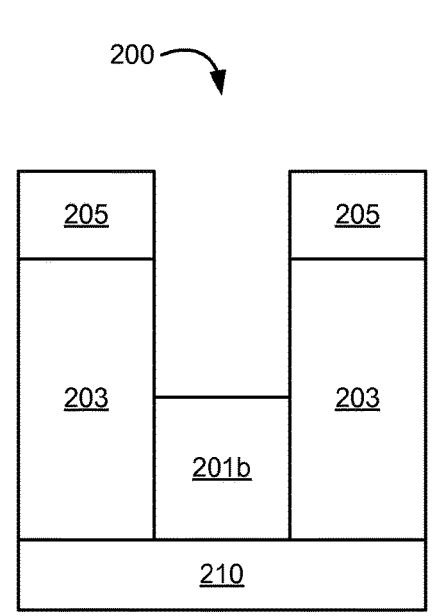

The deposition (FIG. 2B) and activation (FIG. 2C) steps are repeated in a number of cycles in such a way that the Co interconnect 201a is etched without causing damage to the hard mask 205, until the desired Co etch depth is achieved, represented by FIG. 2D. For example, generally, the cycling process may involve:

a. (deposition time 1+activation time 2)*X cycles, for the first few cycles to focus more on deposition build-up on the hard mask;

followed by, b. (deposition time 3+activation time 4)*Y cycles, once some differentiation of the deposition build-up on the mask is obtained, and the subsequent cycling can focus more on Co removal.

For the above formulas, X may be between about 1 and about 10 cycles, or between about 1 and about 6 cycles, while Y may be between about 20 and about 30 cycles. The deposition time 1 associated with performing a net deposition process may be between about 5 and about 60 seconds.

The activation time 2 associated with performing a net deposition process may be between about 10 and about 60 seconds. The deposition time 3 associated with performing a net etch process may be between about 5 and about 60 seconds. The activation time 4 associated with performing a net etch process may be between about 10 and about 60 seconds.

The bias voltage during deposition is generally zero, but a low bias can also be used as long as it does not prevent the formation of the $BCl_x$ layer. A suitable bias during the activation step is about 50 Vb, but it can be altered to achieve the desired result.

Activation energy and bias voltage may also be varied from cycle to cycle. For example, a cycling process performed in accordance with disclosed embodiments may include:

a. (deposition+activation at bias voltage 1)*X cycles, for the first few cycles to focus more on deposition build-up on the hard mask;

followed by, b. (deposition+activation at bias voltage 2)*Y cycles, once some differentiation of the deposition build-up on the mask is obtained, and the subsequent cycling can focus more on Co removal.

For the above formulas, X may be between about 1 and about 10 cycles, or between about 1 and about 6 cycles, while Y may be between about 20 and about 30 cycles. Bias voltage 1 may be between about 20 Vb and about 100 Vb and bias voltage 2 may be between about 30 Vb and about 150 Vb.

The pressure for both deposition and activation operations may be about 2 mT to about 90 mT. The plasma source power can be from about 100 W to 1500 W.

To reduce the damage to the hard mask and achieve desired selectivity, some residual $BCl_x$ may remain on the hard mask once the Co etch is complete at the end of the activation step as described above. In this way, the Co etch can proceed without damage to the hard mask. This result can be further facilitated by tailoring the activation/etch chemistry and conditions such that the part of the $BCl_x$ layer on the hard mask etches no faster, for example slower, than the part of the $BCl_x$ layer on the Co interconnect.

This technology significantly improves both selectivity of Co etch and resulting Co surface roughness. For example, disclosed embodiments may reduce surface roughness to less than 5 nm RMS and may yield at least a 50% improvement in smoothness relative to wet-etched or sputtered surfaces. Without being bound by a particular theory, it is believed that the rough surface of a metal after a wet etch is smoothed by disclosed embodiments due to the etching of protrusions and hills on the surface of the metal that were formed after a wet etch.

In some embodiments, the cyclic deposition and activation operations may be conducted without breaking vacuum, including in the same chamber, or in different chamber modules of a tool. In various embodiments, disclosed embodiments may be integrated with other processes such as ion beam etching, and reactive ion etching.

Figure 3A:
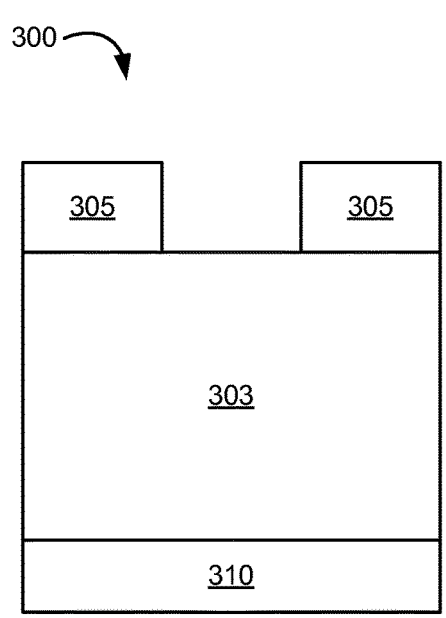
FIGS. 3A-3D are schematic illustrations of an example of subtractive etching in accordance with disclosed embodiments.

Disclosed embodiments are not limited to etching Co interconnects, but can also be applied to blanket (subtractive) Co etches. FIGS. 3A-3D provide an example etching scheme for subtractive etch. Subtractive etching may be performed on a blanket Co layer. FIG. 3A shows a schematic illustration of an example substrate 300 with a blanket Co layer 303 over an etch stop layer 310. A hard mask 305 is deposited over the blanket Co layer 303 and patterned. The hard mask 305 may include a non-metal or a metal. In various embodiments, the hard mask 305 is a metal different from that of the blanket Co layer 303.

Figure 3B:
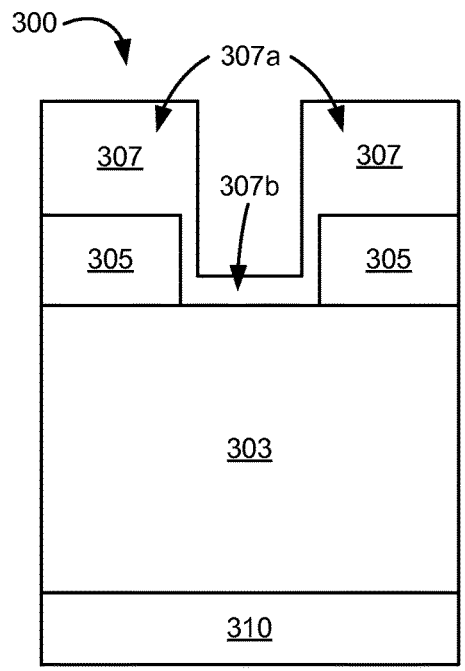

In FIG. 3B, substrate 300 is exposed to a boron-containing halide gas, such as $BCl_3$, and an additive, as described above with respect to operation 104 in FIG. 1. A $BCl_x$ layer 307 is selectively deposited such that the part of the $BCl_x$ layer 307a deposited on the hard mask 305 is thicker than the part of the $BCl_x$ layer 307b deposited on the blanket Co layer 303.

Figure 3C:
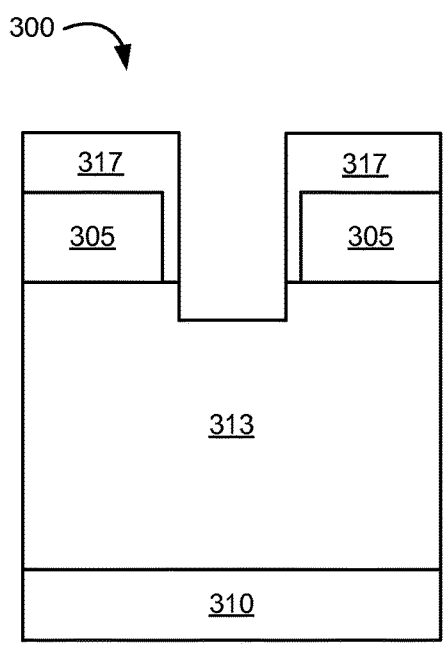

FIG. 3C shows a partially etched Co layer 313 having a recessed portion in the center between the sidewalls of the hard masks 305 and the partially etched $BCl_x$ layer 317 after the substrate 300 in FIG. 3B is exposed to an activation gas and $BCl_x$ layer 307 is etched to form the partially etched $BCl_x$ layer 317. Note that while the $BCl_x$ layer 307 etches at a certain etch rate, since the amount of the part of the $BCl_x$ layer 307a on the hard mask 305 is thicker than the amount of the part of the $BCl_x$ layer 307b deposited on the blanket Co layer 303 in FIG. 3B, the etch may continue into the blanket Co layer 313 while continuing to etch the partially etched $BCl_x$ layer 317, thereby protecting the hard mask 305 from degradation and damage. Note that in various embodiments, the substrate 300 in FIG. 3C is exposed to an activation gas such as argon and a plasma to etch the substrate 300.

As described above with respect to FIG. 1, operations 104 and 106 may be repeated to deposit boron-containing halide material and an additive, and expose the substrate to an activation gas and a plasma in cycles. In some embodiments, deposition durations may be greater than activation gas exposure durations to deposit more boron-containing halide material. In some embodiments, the activation gas exposure duration may be greater than deposition duration to allow more etching of the substrate.

Figure 3D:
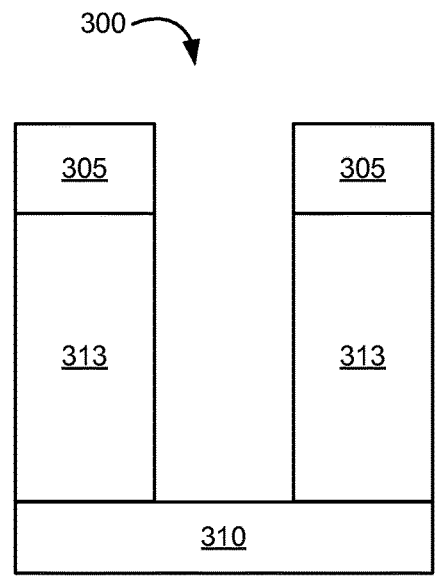

FIG. 3D shows the completely subtractively etched Co 313 after performing sufficient cycles of operations 104 and 106.

Although specific examples of applications of disclosed embodiments are described herein, it will be understood that other applications for etching any non-volatile metals may be performed using disclosed embodiments.

Apparatus

Inductively coupled plasma (ICP) reactors which, in certain embodiments, may be suitable for cyclic deposition and activation processes, including atomic layer etching (ALE) operations and atomic layer deposition (ALD) operations, are now described. Such ICP reactors have also been described in U.S. Patent Application Publication No. 2014/0170853, filed Dec. 10, 2013, and titled "IMAGE REVERSAL WITH AHM GAP FILL FOR MULTIPLE PATTERNING," hereby incorporated by reference in its entirety and for all purposes. Although ICP reactors are described herein, in some embodiments, it should be understood that capacitively coupled plasma reactors may also be used.

Figure 4:
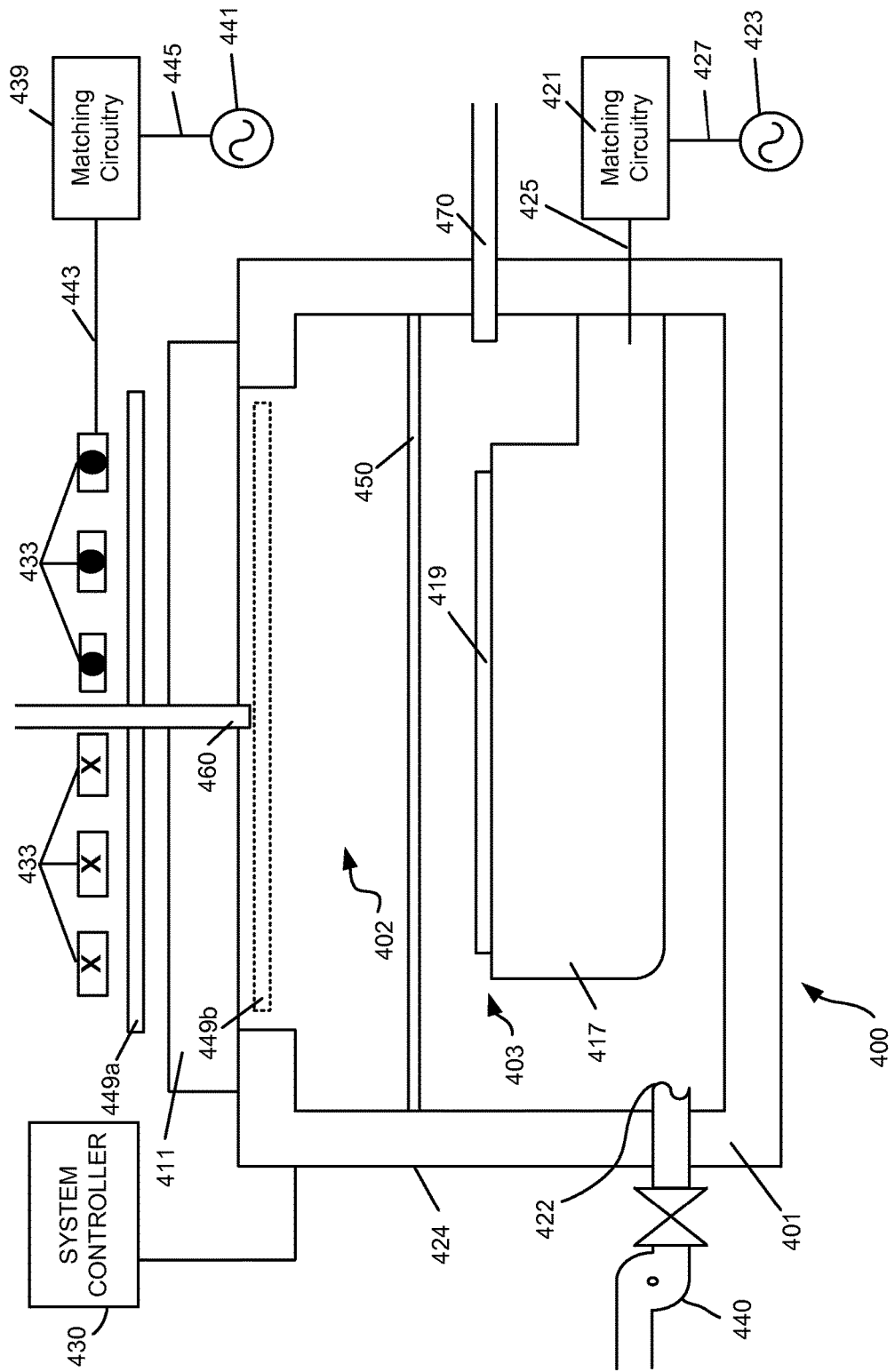
FIG. 4 is a schematic illustration of an example of a chamber suitable for performing disclosed embodiments.

FIG. 4 schematically shows a cross-sectional view of an inductively coupled plasma integrated etching and deposition apparatus 400 appropriate for implementing certain embodiments herein, an example of which is a Kiyo® reactor, produced by Lam Research Corp. of Fremont, Calif. The inductively coupled plasma apparatus 400 includes an overall process chamber 424 structurally defined by chamber walls 401 and a window 411. The chamber walls 401 may be fabricated from stainless steel or aluminum. The window 411 may be fabricated from quartz or other dielectric material. An optional internal plasma grid 450 divides the overall process chamber into an upper sub-chamber 402 and a lower sub-chamber 403. In most embodiments, plasma grid 450 may be removed, thereby utilizing a chamber space made of sub-chambers 402 and 403. A chuck 417 is positioned within the lower sub-chamber 403 near the bottom inner surface. The chuck 417 is configured to receive and hold a semiconductor wafer 419 upon which the etching and deposition processes are performed. The chuck 417 can be an electrostatic chuck for supporting the wafer 419 when present. In some embodiments, an edge ring (not shown) surrounds chuck 417, and has an upper surface that is approximately planar with a top surface of the wafer 419, when present over chuck 417. The chuck 417 also includes electrostatic electrodes for chucking and dechucking the wafer 419. A filter and DC clamp power supply (not shown) may be provided for this purpose. Other control systems for lifting the wafer 419 off the chuck 417 can also be provided. The chuck 417 can be electrically charged using an RF power supply 423. The RF power supply 423 is connected to matching circuitry 421 through a connection 427. The matching circuitry 421 is connected to the chuck 417 through a connection 425. In this manner, the RF power supply 423 is connected to the chuck 417. In various embodiments, a bias power of the electrostatic chuck may be set at about 50 Vb or may be set at a different bias power depending on the process performed in accordance with disclosed embodiments. For example, the bias power may be between about 20 Vb and about 100 Vb, or between about 30 Vb and about 150 Vb.

Elements for plasma generation include a coil 433 is positioned above window 411. In some embodiments, a coil is not used in disclosed embodiments. The coil 433 is fabricated from an electrically conductive material and includes at least one complete turn. The example of a coil 433 shown in FIG. 4 includes three turns. The cross-sections of coil 433 are shown with symbols, and coils having an "X" extend rotationally into the page, while coils having a "●" extend rotationally out of the page. Elements for plasma generation also include an RF power supply 441 configured to supply RF power to the coil 433. In general, the RF power supply 441 is connected to matching circuitry 439 through a connection 445. The matching circuitry 439 is connected to the coil 433 through a connection 443. In this manner, the RF power supply 441 is connected to the coil 433. An optional Faraday shield 449a is positioned between the coil 433 and the window 411. The Faraday shield 449a may be maintained in a spaced apart relationship relative to the coil 433. In some embodiments, the Faraday shield 449a is disposed immediately above the window 411. In some embodiments, the Faraday shield 449b is between the window 411 and the chuck 417. In some embodiments, the Faraday shield 449b is not maintained in a spaced apart relationship relative to the coil 433. For example, the Faraday shield 449b may be directly below the window 411 without a gap. The coil 433, the Faraday shield 449a, and the window 411 are each configured to be substantially parallel to one another. The Faraday shield 449a may prevent metal or other species from depositing on the window 411 of the process chamber 424.

Process gases (e.g. boron-containing halide gas, $BCl_3$, $Cl_2$, Ar, $CH_4$, $CF_4$, $NF_3$, etc.) may be flowed into the process chamber through one or more main gas flow inlets 460 positioned in the upper sub-chamber 402 and/or through one or more side gas flow inlets 470. Likewise, though not explicitly shown, similar gas flow inlets may be used to supply process gases to a capacitively coupled plasma processing chamber. A vacuum pump, e.g., a one or two stage mechanical dry pump and/or turbomolecular pump 440, may be used to draw process gases out of the process chamber 424 and to maintain a pressure within the process chamber 424. For example, the vacuum pump may be used to evacuate the lower sub-chamber 403 during a purge operation of ALD. A valve-controlled conduit may be used to fluidically connect the vacuum pump to the process chamber 424 so as to selectively control application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus 400, one or more process gases such as a boron-containing halide gas, additive, or activation gas, may be supplied through the gas flow inlets 460 and/or 470. In certain embodiments, process gas may be supplied only through the main gas flow inlet 460, or only through the side gas flow inlet 470. In some cases, the gas flow inlets shown in the figure may be replaced by more complex gas flow inlets, one or more showerheads, for example. The Faraday shield 449a and/or optional grid 450 may include internal channels and holes that allow delivery of process gases to the process chamber 424. Either or both of Faraday shield 449a and optional grid 450 may serve as a showerhead for delivery of process gases. In some embodiments, a liquid vaporization and delivery system may be situated upstream of the process chamber 424, such that once a liquid reactant or precursor is vaporized, the vaporized reactant or precursor is introduced into the process chamber 424 via a gas flow inlet 460 and/or 470.

Radio frequency power is supplied from the RF power supply 441 to the coil 433 to cause an RF current to flow through the coil 433. The RF current flowing through the coil 433 generates an electromagnetic field about the coil 433. The electromagnetic field generates an inductive current within the upper sub-chamber 402. The physical and chemical interactions of various generated ions and radicals with the wafer 419 etch features of and selectively deposit layers on the wafer 419.

If the plasma grid 450 is used such that there is both an upper sub-chamber 402 and a lower sub-chamber 403, the inductive current acts on the gas present in the upper sub-chamber 402 to generate an electron-ion plasma in the upper sub-chamber 402. The optional internal plasma grid 450 limits the amount of hot electrons in the lower sub-chamber 403. In some embodiments, the apparatus 400 is designed and operated such that the plasma present in the lower sub-chamber 403 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower sub-chamber 403 through port 422. The chuck 417 disclosed herein may operate at elevated temperatures ranging between about 10° C. and about 250° C. The temperature will depend on the process operation and specific recipe.

Apparatus 400 may be coupled to facilities (not shown) when installed in a clean room or a fabrication facility. Facilities include plumbing that provide processing gases, vacuum, temperature control, and environmental particle control. These facilities are coupled to apparatus 400, when installed in the target fabrication facility. Additionally, apparatus 400 may be coupled to a transfer chamber that allows robotics to transfer semiconductor wafers into and out of apparatus 400 using typical automation.

In some embodiments, a system controller 430 (which may include one or more physical or logical controllers) controls some or all of the operations of a process chamber 424. The system controller 430 may include one or more memory devices and one or more processors. In some embodiments, the apparatus 400 includes a switching system for controlling flow rates and durations when disclosed embodiments are performed. In some embodiments, the apparatus 400 may have a switching time of up to about 500 ms, or up to about 750 ms. Switching time may depend on the flow chemistry, recipe chosen, reactor architecture, and other factors.

In some implementations, the system controller 430 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be integrated into the system controller 430, which may control various components or subparts of the system or systems. The system controller, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 430 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication or removal of one or more layers, materials, metals, oxides, silicon, silicon dioxide, surfaces, circuits, and/or dies of a wafer.

The system controller 430, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 430 receives instructions in the form of data, which specify parameters for each of the processing steps to be performed during one or more operations. It should be understood that the parameters may be specific to the type of process to be performed and the type of tool that the controller is configured to interface with or control. Thus as described above, the system controller 430 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 5:
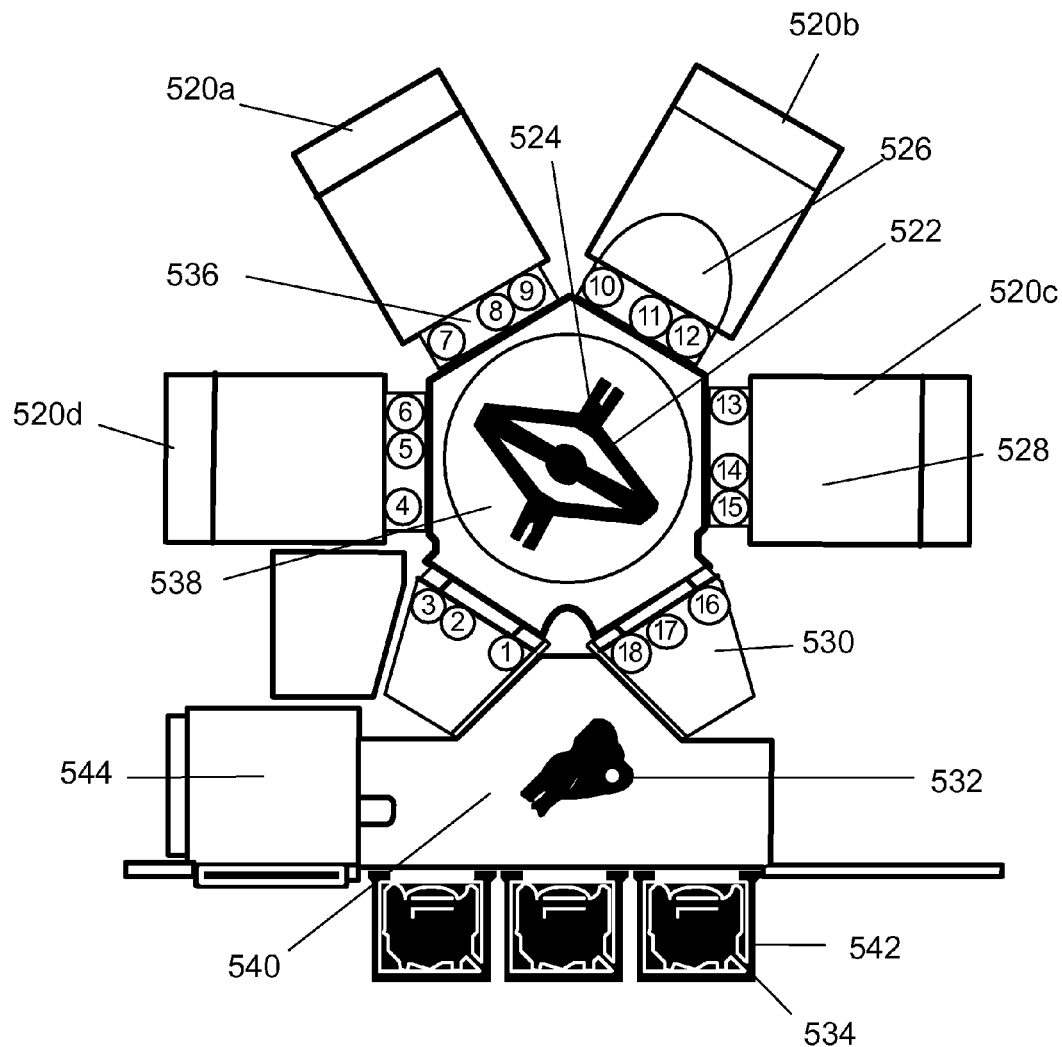
FIG. 5 is a schematic illustration of an example of a tool suitable for performing disclosed embodiments.

FIG. 5 depicts a semiconductor process cluster architecture with various modules that interface with a vacuum transfer module 538 (VTM). The arrangement of various modules to "transfer" wafers among multiple storage facilities and processing modules may be referred to as a "cluster tool architecture" system. Airlock 530, also known as a loadlock or transfer module, interfaces with the VTM 538 which, in turn, interfaces with four processing modules 520a-520d, which may be individual optimized to perform various fabrication processes. By way of example, processing modules 520a-520d may be implemented to perform substrate etching, deposition, ion implantation, wafer cleaning, sputtering, and/or other semiconductor processes. In some embodiments, ALD and ALE are performed in the same module. In some embodiments, ALD and ALE are performed in different modules of the same tool. One or more of the substrate etching processing modules (any of 520a-520d) may be implemented as disclosed herein, i.e., for depositing conformal films, selectively depositing films by ALD, etching patterns, etching metal, and other suitable functions in accordance with the disclosed embodiments. Airlock 530 and processing modules 520a-520d may be referred to as "stations." Each station has a facet 536 that interfaces the station to VTM 538. Inside each facet, sensors 1-18 are used to detect the passing of wafer 526 when moved between respective stations.

Robot 522 transfers wafer 526 between stations. In one embodiment, robot 522 has one arm, and in another embodiment, robot 522 has two arms, where each arm has an end effector 524 to pick wafers such as wafer 526 for transport. Front-end robot 532, in atmospheric transfer module (ATM) 540, is used to transfer wafers 526 from cassette or Front Opening Unified Pod (FOUP) 534 in Load Port Module (LPM) 542 to airlock 530. Module center 528 inside processing modules 520a-520d is one location for placing wafer 526. Aligner 544 in ATM 540 is used to align wafers.

In an exemplary processing method, a wafer is placed in one of the FOUPs 534 in the LPM 542. Front-end robot 532 transfers the wafer from the FOUP 534 to an aligner 544, which allows the wafer 526 to be properly centered before it is etched or processed. After being aligned, the wafer 526 is moved by the front-end robot 532 into an airlock 530. Because the airlock 530 has the ability to match the environment between an ATM 540 and a VTM 538, the wafer 526 is able to move between the two pressure environments without being damaged. From the airlock 530, the wafer 526 is moved by robot 522 through VTM 538 and into one of the processing modules 520a-520d. In order to achieve this wafer movement, the robot 522 uses end effectors 524 on each of its arms. Once the wafer 526 has been processed, it is moved by robot 522 from the processing modules 520a-520d to the airlock 530. From here, the wafer 526 may be moved by the front-end robot 532 to one of the FOUPs 534 or to the aligner 544.

It should be noted that the computer controlling the wafer movement can be local to the cluster architecture, or can be located external to the cluster architecture in the manufacturing floor, or in a remote location and connected to the cluster architecture via a network. A controller as described above with respect to FIG. 4 may be implemented with the tool in FIG. 5.

EXPERIMENTAL

Experiment 1

Figure 6A:
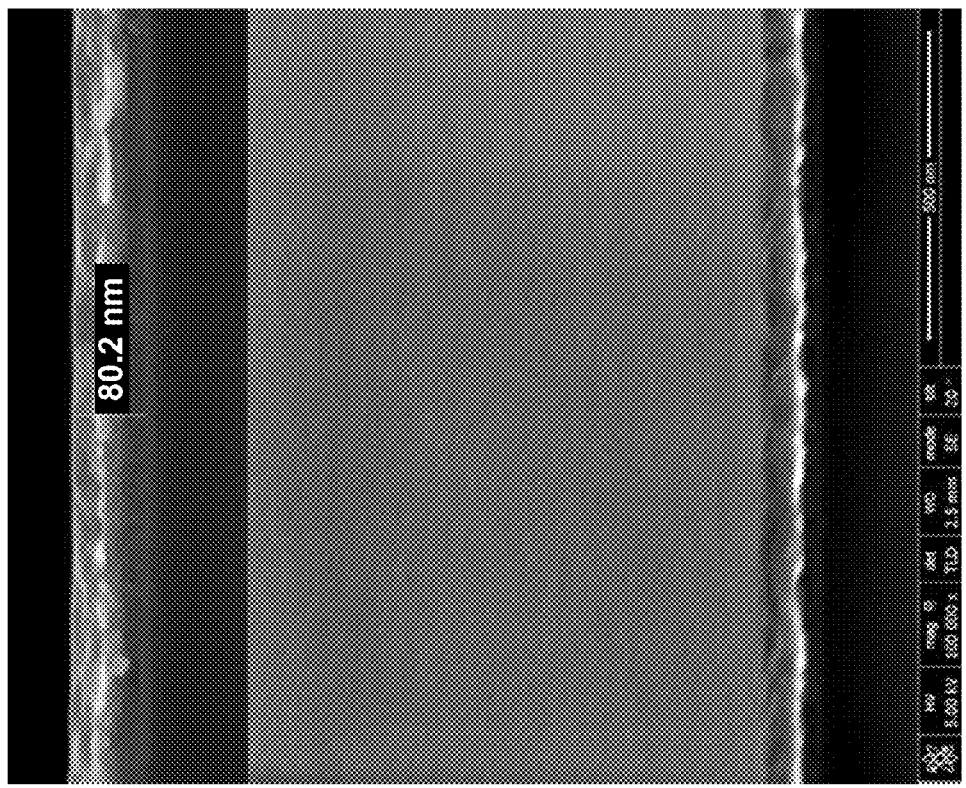
FIGS. 6A and 6B are images of substrates used in experiments.
Figure 6B:
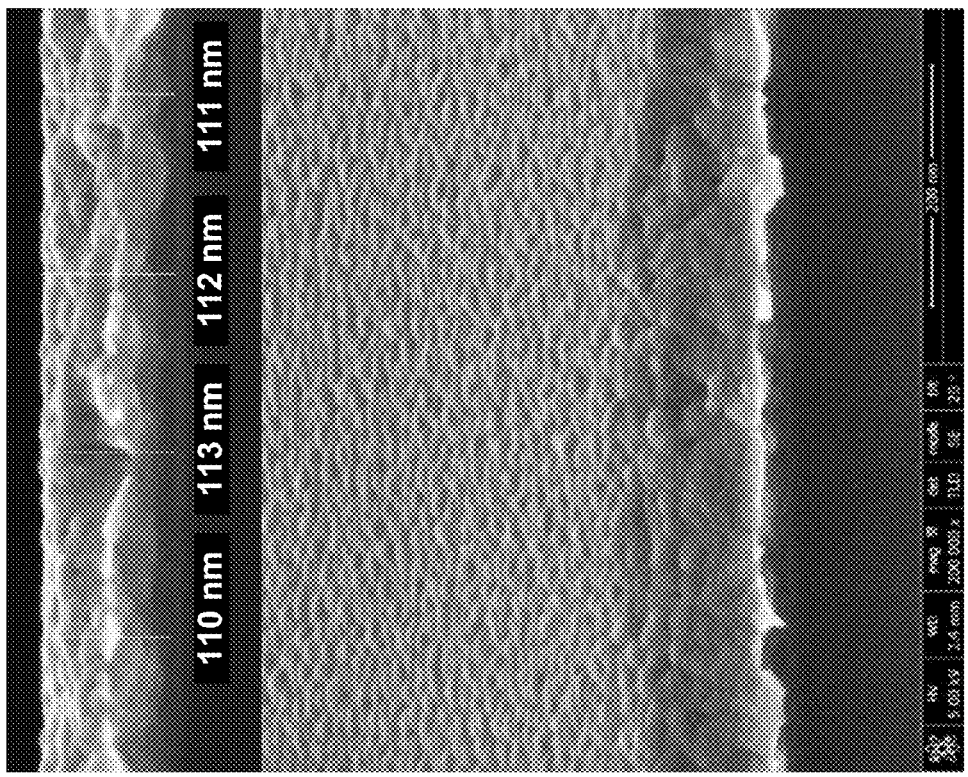

An experiment was conducted and smoothness of substrates was evaluated. A blanket film stack on a silicon substrate including an oxide, titanium nitride as an adhesion layer, and 100 nm of cobalt was evaluated prior to etch. An image was taken as shown in FIG. 6A, which shows various lumps and grains across the surface of the substrate, and at the interface between various layers, suggesting high roughness. Measurements were taken as shown, which showed thicknesses of 110 nm, 113 nm, 112 nm, and 111 nm. The substrate was then etched using disclosed embodiments. The substrate including a previously recessed cobalt layer (recessed by a wet etch) with a hard mask deposited and patterned over it was exposed to $BCl_3$ and an additive to deposit a $BCl_x$ layer on the substrate, and then the substrate was exposed to an activation gas and a plasma was turned on. The substrate was exposed to alternate pulses of $BCl_3$ with additive and activation gas with plasma for 20 cycles. The etched substrate was then evaluated for roughness. An image was taken of the resulting substrate as shown in FIG. 6B and the thickness was measured at 80.2 nm. The substrate exhibits a smooth surface of less than 5 nm RMS and at least a 50% improvement in smoothness.

Experiment 2

Figure 7:
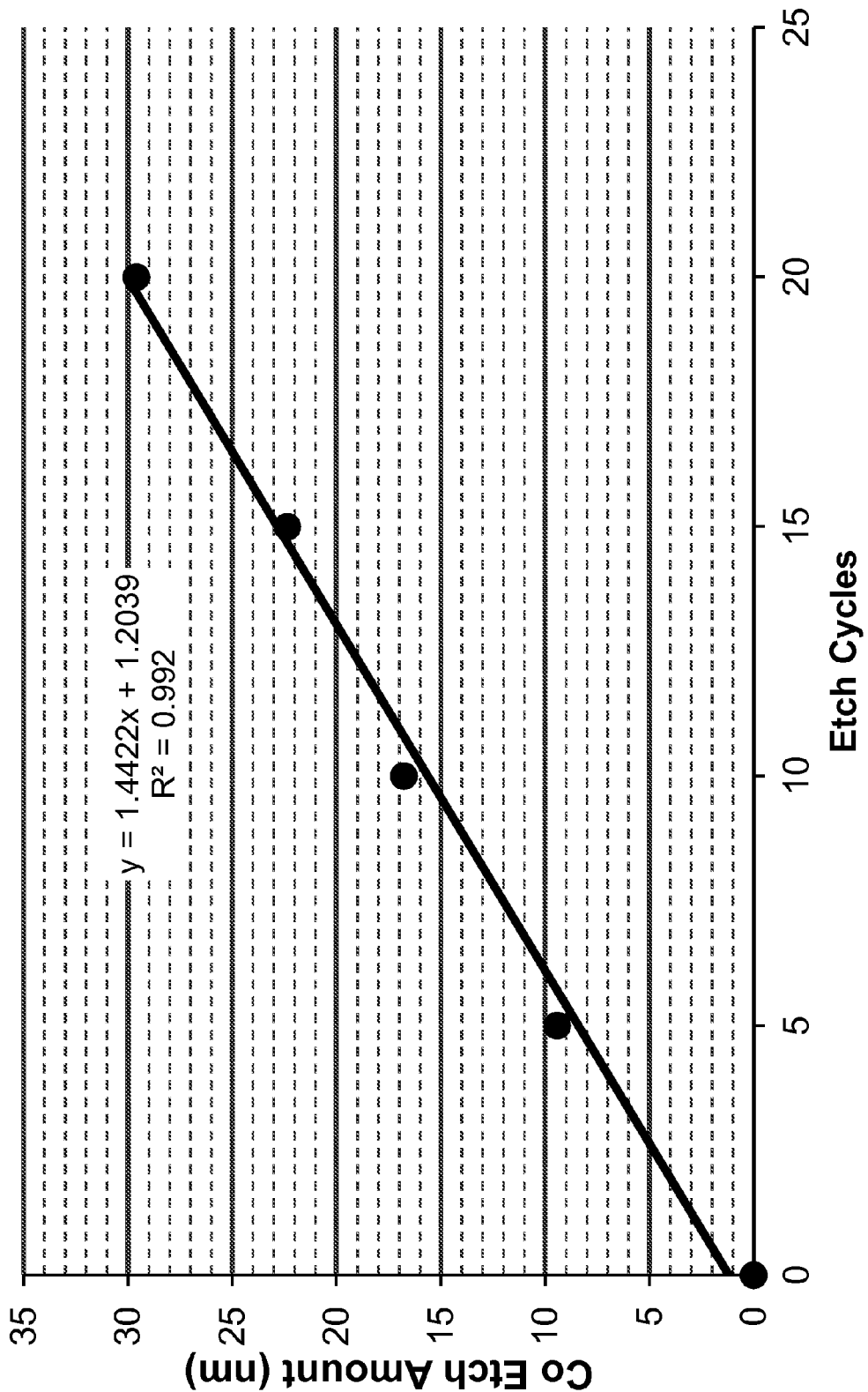
FIG. 7 is a graph depicting etch rates for performing disclosed embodiments in an experiment.

An experiment was conducted and etch rate of disclosed embodiments were measured. A substrate having a blanket cobalt layer to be etched and a deposited and patterned hard mask over the cobalt layer was exposed to $BCl_3$ and an additive. The substrate was then exposed to an activation gas and a plasma. The substrate was exposed to cycles of $BCl_3$ with additive and activation gas with plasma for over 20 cycles. The cycles etched cobalt in a mostly linear pattern at an etch rate of about 1.4422 nm/cycle. Data points and a linear model for the cobalt removal amount over number of cycles are depicted in FIG. 7.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of processing a substrate in a chamber, the method comprising:
cyclically,
(a) conducting a deposition, comprising exposing a substrate to a boron-containing halide gas and an additive selected from the group consisting of hydrogen-containing and halogen-containing gases for a duration sufficient to selectively deposit a first layer of boron-containing halide material on a surface of a mask on the substrate, the mask comprising a material consisting of elements selected from the group consisting of nitrogen, oxygen, carbon, and titanium atoms, and the duration sufficient to selectively deposit a second layer of boron-containing halide material on a surface of a non-volatile metal of the substrate selected from the group consisting of cobalt, iron, manganese, nickel, platinum, palladium, and ruthenium on the substrate, wherein the first layer is thicker than the second layer due at least in part to chemical selectivity; and
(b) conducting an activation, comprising exposing the substrate to an activation gas and an activation source that ionizes the activation gas to form an activated activation gas to react with the first and second layers of boron-containing halide material on the mask and the non-volatile metal to form etch products in a self-limiting etch of the substrate;
wherein (a) and (b) are conducted for a first set of cycles, followed by (a) and (b) conducted for a second set of cycles, in which the duration of (a) is longer in the first set of cycles than the duration of (a) in the second set of cycles resulting in a net deposition process, and in which the duration of (b) in the second set of cycles is longer than the duration of (b) in the first set of cycles, resulting in a net etch process.

2. The method of claim 1, wherein the second set of cycles is greater in number than the first set of cycles.

3. The method of claim 2, wherein the first set of cycles numbers between 1 and 10, and the second set of cycles numbers between 20 and 30.

4. The method of claim 1, wherein a bias is applied during (b).

5. The method of claim 3, wherein a bias is applied during (b) at a first bias power during the first set of cycles and a second bias power during the second set of cycles.

6. The method of claim 5, wherein the second bias power is between about 30 V and about 150 V.

7. The method of claim 1, wherein the additive is selected from the group consisting of $H_2$, $CH_4$, $CF_4$, $NF_3$, $Cl_2$, and combinations thereof.

8. The method of claim 1, wherein the activation gas is selected from the group consisting of Ar, $H_2$, $CH_4$, $CF_4$, He, Ne, Xe, $NF_3$, and combinations thereof.

9. The method of claim 1, wherein the boron-containing halide gas is selected from the group consisting of $BCl_3$, $BBr_3$, $BF_3$, and $BI_3$.

10. The method of claim 1, wherein the non-volatile metal is cobalt.

11. The method of claim 1, wherein the activation source is a plasma.

12. The method of claim 11, wherein the plasma power is between about 100 W and about 1500 W.

13. The method of claim 1, wherein the substrate is patterned.

14. The method of claim 1, wherein the chamber pressure is between about 2 mT and about 90 mT.

15. The method of claim 1, wherein roughness of the surface of the metal is less than about 5 nm RMS.

16. The method of claim 1, wherein (a) and (b) are performed without breaking vacuum.

17. The method of claim 1, wherein (a) comprises a self-limiting reaction.

18. The method of claim 1, wherein the metal is cobalt and the mask is TiN.

19. The method of claim 1, wherein the metal is cobalt and the mask is an ashable hard mask made primarily of carbon material.

* * * * *